SOLID STATE DEVICE INCLUDING ELECTRICAL PACKAGING ARRANGEMENT WITH IMPROVED ELECTRICAL CONNECTIONS

Original Filed June 23, 1965

*INVENTOR.*
CHARLES CHIOU
JOSEPH R. GARCIA
BY Harry M Weiss
ATTORNEY 3,428,866

SOLID STATE DEVICE INCLUDING ELECTRICAL PACKAGING ARRANGEMENT WITH IMPROVED ELECTRICAL CONNECTIONS

Charles Chiou, Wappingers Falls, and Joseph R. Garcia, Poughkeepsie, N.Y., assignors to International Business Machines Corporation, Armonk, N.Y., a corporation of New York Original application June 23, 1965, Ser. No. 466,182, now Patent No. 3,325,882, dated June 20, 1967. Divided and this application Dec. 12, 1966, Ser. No. 623,158
U.S. Cl. 317—101 6 Claims
Int. Cl. H02b *1/04*

ABSTRACT OF THE DISCLOSURE

An electrical packaging arrangement having a substrate preferably of a ceramic insulating material wherein a solid state device is supported by the substrate with a surface of the solid state device being spaced from the substrate surface. The top surface of the solid state device is substantially in the same plane with the top surface of the substrate. A plurality of electrically conductive lands extend from the surface of the solid state device across the space to the surface of the substrate.

This is a division of application Ser. No. 466,182, filed June 23, 1965, now U.S. Patent No. 3,325,882, issued June 20, 1967.

This invention is directed generally to a method for forming electrical connections to a solid state device including the electrical packaging arrangement therefor and, more particularly, to a method for forming electrical connections to a monolithic or integrated semiconductor device including the electrical packaging arrangement therefor.

Recent trends in the semiconductor art have been in the direction of miniaturization of semiconductor device structures to achieve higher operating speeds, lower cost of fabrication, and greater component reliability. Some of these miniature semiconductor device structures consist of a number of diodes, transistors, etc., all of which are formed or fabricated in a single substrate of the same semiconductor material as the semiconductor device. Other fabrication techniques form all the individual semiconductor devices in a support structure of any desired material. These fabrication techniques are being extensively developed in order to permit the utilization of the fabricated semiconductor device components into large and complex electronic equipment, such as computers requiring higher speed operation. However, regardless of the way the miniaturized semiconductor device structures are made, electrical connections must be formed between each semiconductor device structure and the supporting substrate.

Monolithic or integrated circuit device structures are currently being made at very low cost and with a high degree of reliability, but there have been technical problems in providing reliable external electrical leads that extend to the desired circuit portion of each monolithic or integrated circuit structure from a supporting substrate. Consequently, the failure to make consistently reliable, external electrical interconnections between a semiconductor device structure and a supporting substrate prevents the formation of electrical systems for utilization in electronic devices such as computers.

One of the technical problems in forming electrical interconnections between a semiconductor device structure and a supporting substrate is fracture of the semiconductor device structure due to differences in thermal expansion coefficients between the substrate and the semiconductor device structure.

One technique that has been developed is to use layers of an epoxy resin or alternatively, metal etch resist material that is built up between the semiconductor chips or device structures mounted on a glass or ceramic substrate. Interconnections have then been applied over these layers to connect up the electrically conductive lands formed in the chips and the substrate. Subsequently, the interconnectors were strengthened by an electroless metal plating operation. Disadvantages of this technique are the differences in thermal coefficients of expansion between the materials and shrinkage of the applied layers of material after application or while being cured.

Thermal compression bonding has also been suggested for electrically interconnecting semiconductor chips to each other or to their supporting substrate. However, where many bonds must be made it is necessary that the entire package be kept at the relatively high bonding temperature until everything has been joined together. Newer techniques utilize the local heating approach, e.g., microwelding and high power density processes. It has been shown that gas and ruby lasers can provide sufficient power for localized bonding operation between solid state circuits. However, all of these above described techniques are relatively complex, time consuming, and consequently very costly.

The extension of planar transistor technology to monolithic or integrated circuits has created a need for new interconnection techniques. Each new technique should provide a reliable, inexpensive, interconnection scheme for monolithic circuits. One approach in meeting this objective is to evaporate planar interconnections. This process not only forms the necessary interconnectors, but also provides bonding through diffusion. The general concept is to mount monolithic chips into cavities of a multilaminated ceramic substrate so that the planar surface of the chips is essentially flush with the substrate surface. The space between the chips and the substrate is bridged with a layer of material that forms a continuous surface which is suitable for the subsequent deposition of interconnecting lands. Where the bridging material is a permanent part of the chip-substrate package or assembly, investigations showed that, when the planar, interconnecting, chip-substrate samples were subjected to thermal-cycling and mechanical tests, the stresses resulting from the relative differences in thermal-expansion between the chip, the substrate, and the bridging material remained as a serious problem.

Successful application of the evaporated planar interconnections to monolithic integrated circuits very much relies on the selection of a desirable bridging material. The requirements imposed for a suitable bridging material are generalized as follows: The bridging material must be easy to apply, the bridging material must not introduce stresses into the chip-substrate assembly, the bridging material must form a surface suitable for nucleation and growth of metallic films, the bridging material should withstand temperatures to 350° C. or higher, the bridging material must have little or no shrinkage after it is applied or cured, and the bridging material must meet the other deposition conditions such as chemical stability, no degassing, etc.

Accordingly, it is an object of this invention to provide an improved method for forming electrical connections to a solid state device.

It is another object of this invention to provide an improved method for interconnecting electrically conductive lands on a substrate with corresponding lands on a semiconductor chip or device structure supported by the substrate and spaced therefrom.

It is a further object of this invention to provide an improved electrical packaging arrangement suitable for permitting interconnections between a planar semiconductor chip or device structure and a substrate.

It is another object of this invention to provide an improved bridging technique including an improved bridging material useful for forming interconnections between a substrate and a semiconductor device structure.

It is still another object of this invention to provide a temporary bridging material that is easily applied and easily removable, yet serving to permit the formation of interconnections between a substrate and a semiconductor device structure.

It is still a further object of this invention to provide an improved method for forming electrically conductive interconnections between a semiconductor device structure and a substrate that is reliable and inexpensive.

In accordance with one embodiment of the invention, a method for forming electrical connections to a solid state device comprises positioning the solid state device having electrically conductive lands on a support member or substrate also having electrically conductive lands. The electrically conductive lands on the substrate are spaced from the electrically conductive lands on the solid state device. The space located between the electrically conductive lands on the solid state device and the substrate is filled in with a removable powdered material. Where the solid state device is made of silicon, the removable powdered material is composed of small $SiO_2$ pellets. Interconnecting electrically conductive lands are formed on the surface of the powdered material by suitable deposition. Preferably, the interconnecting lands are formed by evaporating the conductive metal through a suitable mask in order to permit the interconnecting electrically conductive lands to link up correspondingly aligned lands on the substrate and the solid state device. The powdered material is removed from the space located between the electrically conductive lands of the solid state device and the substrate thereby leaving the solid state device spaced from the substrate, but with the electrically conductive lands on the solid state device electrically interconnected to the electrically conductive lands on the substrate.

In accordance with another embodiment of the invention, an electrical packaging arrangement comprises a substrate preferably of a ceramic insulating material such as alumina. A solid state device is supported by the substrate with a surface of the solid state device being spaced from the substrate surface. Preferably, the top surface of the solid state device is substantially in the same plane with the top surface of the substrate. A plurality of electrically conductive lands are provided which extend from the surface of the solid state device across the space to the surface of the substrate.

The foregoing and other objects features and advantages of the invention will be apparent from the following more particular description and preferred embodiments of the invention as illustrated in the accompanying drawings.

Figure 1A:
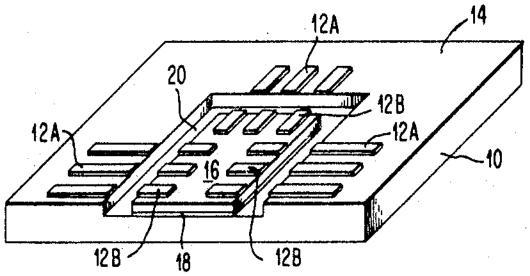
FIG. 1A is an enlarged perspective view of a semiconductor device structure mounted in a cavity portion of a substrate with electrically conductive lands formed on the semiconductor device structure and on the substrate.

Referring to FIG. 1A, a substrate generally designated by reference numeral 10 is composed of any suitable insulating material such as ceramic or glass. Preferably, the substrate 10 is made of alumina and electrically conductive lands 12A formed on surface 14 in the line with electrically conductive lands 12B formed on the top surface of a semiconductor device structure 16. In one example, each land 12A or 12B had a thickness of approximately 1 micron and a width of approximately 4 mils with the distance between the center line of two adjacent lands being approximately 8 mils. While only the nine lands on the substrate 10 and the semiconductor device structure 16 are shown, it is evident that any number of lands can be used as desired.

The size of the alumina substrate 10 was approximately 400 mils by 400 mils with a thickness of 30 mils. The semiconductor device structure 16 was 56 mils by 56 mils and had a thickness of between 8 to 10 mils. The semiconductor device structure 16 is preferably a monolithic or integrated device structure made of silicon and having a plurality of active semiconductor devices such as transistors and diodes formed therein. The lands 12B are preferably formed of aluminum on a glass protecting layer formed on the planar surface of the device 16. Consequently, metal contacts, formed through suitable openings in the glass protecting layer which make electrical contacts with the desired active semiconductor regions of P or N type material, are brought to the surface of the device 16 for suitable interconnection with other semiconductor devices or passive elements such as resistors, capacitors, etc.

On the surface 14 of the substrate 10 the lands are formed by depositing a metal such as chromium that wets the ceramic and then depositing such as by evaporation, through a mask, an aluminum or copper layer to form the electrically conductive lands. The chromium layer has a thickness of about 5,000 angstroms.

The semiconductor device 16 is bonded to the substrate 10 by a bonding layer 18 which is formed at the bottom of a cavity 20. The cavity 20 can be formed by Mo-Mn bonding a pre-cut and pre-drilled 10 mil alumina sheet onto a 20 alumina blank thereby providing a flat base or bottom surface for the cavity 20. Alternatively, the cavity 20 can be formed by pressing out the cavity configuration while the ceramic is in its green state. The top surface of the semiconductor device structure 16 is in the same plane as the top surface 14 of the substrate 10. In one example, the dimensions of the cavity 20 was 59 mils by 59 mils and the depth of the cavity 20 was substantially equal to the thickness of the semiconductor device 16 including the bonding layer 18. The bonding layer 18 was formed by evaporating metalized coatings of chromium and then gold on the bottom portion of the cavity 20 to a thickness of 0.5 and 3 microns, respectively, with the substrate 10 being held at a temperature of about 350° C. The gold metallization is to facilitate the gold-silicon eutectic bonding of the structure 16 to the substrate 10. Additionally, a metal coating of 2.5 microns of gold is also deposited on the surface of the structure 16 that is to be bonded to the substrate 10, thereby insuring the formation of the gold-silicon eutectic bonding layer 18. In bonding, a pressure of 300 grams is applied to the surface of the semiconductor device structure 16 while the structure 16 and substrate 10 are heated to a temperature over 370° C. for a period of time sufficient to form the bonding layer 18 which forms at 370° C. and is a gold-silicon eutectic. The gold-silicon eutectic bonding layer provides a bonding region that has good corrosion resistance and high thermal conductance. In addition, the melting point of the gold-silicon eutectic (370° C.) is high enough to offer an adequate temperature ceiling for subsequent processing steps.

Figure 1B:
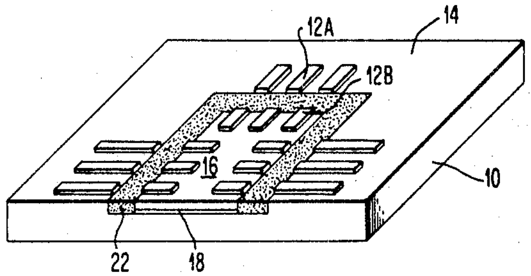
FIG. 1B is a perspective view similar to FIG. 1A with $SiO_2$ powders packed into the space formed by the substrate cavity surrounding the semiconductor device structure.

Referring to FIG. 1B, a temporary fill material such as silicon dioxide powders 22 are compacted by vibration with any suitable commercially available vibration tool into the cavity space 20 located about the structure 16 which is mounted on the substrate 10. Accordingly, the structure 16 is located in a moat of silicon dioxide powders 22 which are formed to the surface of the structure 16 by means of a flattening device such as a squeegee. The function of the silicon dioxide powders 22 is to form a continuous surface for the subsequent deposition of interconnectors.

Figure 1C:
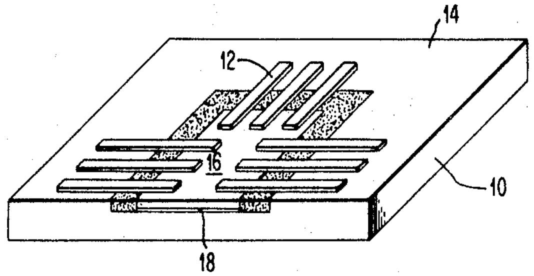
FIG. 1C is a view similar to FIG. 1B after the interconnecting lands have been formed on the $SiO_2$ powders thereby interconnecting the lands on the semiconductor device structure with the corresponding lands on the substrate.

Referring to FIG. 1C, the silicon dioxide powders 22 function as a bridge for the evaporation of a metallic coating between the lands 12A on the substrate 10 and the lands 12B on the semiconductor device structure 16. Preferably, aluminum interconnections 12 are deposited by evaporation through a molybdenum mask which is optically aligned with the lands. In one embodiment, the structure-substrate assembly was placed in a suitable vacuum system at a pressure in the range of 5 to $10 \times 10^{-6}$ torr and the assembly was kept at a temperature of 300° C.

Figure 1D:
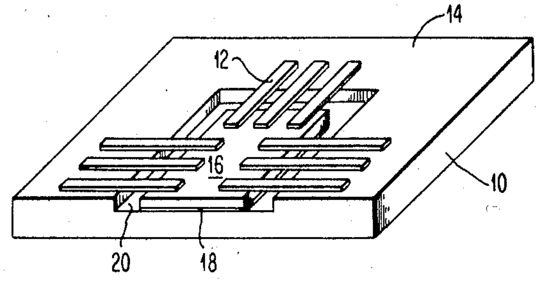
FIG. 1D is a view similar to FIG. 1C showing the final electrical packaging arrangement after the silicon dioxide powders have been removed from the substrate cavity.

Referring to FIG. 1D, the silicon dioxide powders 22 previously shown in FIG. 1C have been ultrasonically blown or cleaned out thereby leaving the cavity 20 empty as previously existed in FIG. 1A. However, the electrically conductive lands 12 now extend between the semiconductor device structure 16 and the surface 14 of the substrate 10. In one example, the $SiO_2$ powders 22 were removed after the entire electrical packaging arrangement was placed in a beaker containing an acetone solution for a three minute ultrasonic cleaning operation. The resulting electrical packaging arrangement has self-supporting lands which have successfully withstood centrifuging tests up to 80,000*g* level, shock tests of 10 blows at the 10,000*g* level, and thermal cycling tests (1000 cycles between −40° C. and +150° C.).

It should be evident to those skilled in the art that various electrical connections can be made to the portions of the lands located on the surface 14 of the substrate 10. For example, electrically conductive pins can be used which would extend through the thickness of the substrate 10 and connect the lands on the surface 14 of the substrate with a suitable "mother" card containing a printed circuit pattern and a number of other substrates. In this manner, an electrical system based on this arrangement can be provided for use in electric equipment such as computers. Another technique in packaging would be to provide buried conductive layers in the substrate 10 which would be electrically connected to the lands on the surface of the substrate 10.

The $SiO_2$ powders are preferably 1 micron in size and can be formed by centrifuging techniques as described in co-pending U.S. patent applications entitled "Method of Forming a Glass Film on an Object and the Product Produced Thereby" and "Method of Forming a Glass Film on an Object," whose respective serial numbers and filing dates are S.N. 141,668 and S.N. 181,743, filed Sept. 29, 1961, and Mar. 22, 1962, respective U.S. Patent Nos. 3,212,921 and 3,212,929, and assigned to the same assignee of this invention.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An electrical packaging arrangement comprising, in combination, a ceramic substrate having at least one cavity located therein, the bottom of said cavity having a metal coating wetting said ceramic surface, a silicon semiconductor device located within said cavity, said silicon semiconductor device having a silicon-gold eutectic bonding layer connecting said silicon semiconductor device with said metal coating on the bottom surface of said cavity, said cavity being larger in area than said semiconductor device, the top surface of said semiconductor device being substantially in the same plane with the top surface of said ceramic substrate and spaced therefrom; and a plurality of electrically conductive lands extending from the top surface of said semiconductor device across the cavity space to the top surface of said ceramic substrate.

2. An electrical packaging arrangement comprising, in combination, a ceramic substrate having at least one cavity located therein, a semiconductor device located within said cavity, the bottom of said cavity having an adhesive coating wetting said ceramic surface and bonding said device to said ceramic surface, said cavity being larger in area than said semiconductor device, the top surface of said semiconductor device being substantially in the same plane with the top surface of said ceramic substrate and spaced therefrom; and a plurality of electrically conductive lands extending from the top surface of said semiconductor device across the cavity space to the top surface of said ceramic substrate, wherein said lands are adherent directly to said device in all portions over which they extend.

3. An electrical packaging arrangement comprising, in combination, a ceramic substrate having at least one cavity located therein, the bottom of said cavity having a metal coating wetting said ceramic surface, a semiconductor device located within said cavity, said semiconductor device having a metal bonding layer connecting said semiconductor device with said metal coating on the bottom surface of said cavity, said cavity being larger in area than said semiconductor device, the top surface of said semiconductor device being substantially in the same plane with the top surface of said ceramic substrate and spaced therefrom; and a plurality of electrically conductive lands extending from the top surface of said semiconductor device across the cavity space to the top surface of said ceramic substrate, wherein said lands are adherent directly to said device in all portions over which they extend.

4. The packaging arrangement of claim 3 wherein the said semiconductor device is composed of silicon.

5. The package arrangement of claim 1 wherein the said metal coating is chromium.

6. The package arrangement of claim 3 wherein a material substantially fills the space between the device and the substrate in said cavity.

References Cited

UNITED STATES PATENTS

| | | | |
|---|---|---|---|
| 3,190,952 | 6/1965 | Bitko | 174—52 |
| 3,271,625 | 9/1966 | Caracciolo | 317—101 |
| 3,312,540 | 4/1967 | Plumbo et al. | 174—52 |
| 3,312,771 | 4/1967 | Hessinger et al. | 174—52 |
| 3,320,353 | 5/1967 | Smith | 174—52 |
| 3,325,882 | 6/1967 | Chiou et al. | 317—10 |

LEWIS H. MYERS, *Primary Examiner.*

J. R. SCOTT, *Assistant Examiner.*

U.S. Cl. X.R.

317—234